United States Patent
Minoguchi et al.

(10) Patent No.: US 12,308,890 B2
(45) Date of Patent: May 20, 2025

(54) OPTICAL POWER RECEPTION APPARATUS, COMMUNICATION APPARATUS AND OPTICAL POWER RECEPTION METHOD

(71) Applicant: NIPPON TELEGRAPH AND TELEPHONE CORPORATION, Tokyo (JP)

(72) Inventors: Kyo Minoguchi, Musashino (JP); Hiroaki Katsurai, Musashino (JP); Yoichi Fukada, Musashino (JP); Tomoaki Yoshida, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 138 days.

(21) Appl. No.: 18/025,673

(22) PCT Filed: Sep. 14, 2020

(86) PCT No.: PCT/JP2020/034721
§ 371 (c)(1),
(2) Date: Mar. 10, 2023

(87) PCT Pub. No.: WO2022/054282
PCT Pub. Date: Mar. 17, 2022

(65) Prior Publication Data
US 2023/0344525 A1   Oct. 26, 2023

(51) Int. Cl.
*H04B 10/80* (2013.01)
*H02J 7/35* (2006.01)
*H04B 10/60* (2013.01)

(52) U.S. Cl.
CPC .............. *H04B 10/807* (2013.01); *H02J 7/35* (2013.01); *H04B 10/60* (2013.01)

(58) Field of Classification Search
None
See application file for complete search history.

(56) References Cited

U.S. PATENT DOCUMENTS

| | | | | |
|---|---|---|---|---|
| 5,796,890 A * | 8/1998 | Tsuji | ...... | G08C 23/06 398/1 |
| 6,362,906 B1 * | 3/2002 | O'Shea | ...... | H01Q 21/061 342/368 |
| 7,072,475 B1 * | 7/2006 | DeNap | ...... | H04B 1/385 381/74 |
| 2008/0158137 A1 * | 7/2008 | Yoshida | ...... | G09G 3/3622 250/214 A |

(Continued)

OTHER PUBLICATIONS

M. Liu et al., "High-Performance InGaAs/InP Single-Photon Avalanche Photodiode", in IEEE Journal of Selected Topics in Quantum Electronics, vol. 13, No. 4, pp. 887-894, Jul.-Aug. 2007.

*Primary Examiner* — Darren E Wolf
(74) *Attorney, Agent, or Firm* — Harness, Dickey & Pierce, P.L.C.

(57) ABSTRACT

A light receiving portion of a photodiode is connected to an external light source via an optical transmission line. A power storage unit stores electrical energy generated by the photodiode. A bias circuit takes out electrical energy corresponding to the amount of stored power from the power storage unit, and applies a voltage to the cathode of the photodiode.

5 Claims, 4 Drawing Sheets

(56) References Cited

U.S. PATENT DOCUMENTS

| | | | |
|---|---|---|---|
| 2008/0235418 A1* | 9/2008 | Werthen | H04B 10/807 |
| | | | 710/106 |
| 2009/0166509 A1* | 7/2009 | Kline | H04B 10/807 |
| | | | 136/244 |
| 2010/0014854 A1* | 1/2010 | Healey | H04B 10/801 |
| | | | 398/16 |
| 2016/0287885 A1* | 10/2016 | Saini | H04B 10/40 |

* cited by examiner

OPTICAL POWER RECEPTION APPARATUS, COMMUNICATION APPARATUS AND OPTICAL POWER RECEPTION METHOD

CROSS-REFERENCE TO RELATED APPLICATIONS

This application is a 371 U.S. National Phase of International Application No. PCT/JP2020/034721, filed on Sep. 14, 2020. The entire disclosure of the above application is incorporated herein by reference.

TECHNICAL FIELD

The present invention relates to an optical power receiving device (an optical power reception apparatus), a communication apparatus and an optical power receiving method (an optical power reception method).

BACKGROUND ART

Regarding an information communication network that conducts communication using optical signals between a central device and a remote device that is provided at a distance from the central device, there is a demand for an increase in the degree of freedom in the position of the remote device. As a means to increase the degree of freedom in the position of the remote device, there is a suggested function of converting light transmitted from the central device into electrical energy so that the remote device is operated by the electrical energy.

As a means to convert light into electrical energy, a light receiving element such as a photodiode is known. Non Patent Literature 1 discloses a technique for enhancing light detection efficiency by applying a bias voltage to a photodiode.

CITATION LIST

Non Patent Literature

Non Patent Literature 1: M. Liu et al., "High-Performance InGaAs/InP Single-Photon Avalanche Photodiode," in IEEE Journal of Selected Topics in Quantum Electronics, vol. 13, no. 4, pp. 887-894, July-August 2007

SUMMARY OF INVENTION

Technical Problem

In the optical power receiving technology for converting light energy into electrical energy with a photodiode, it is expected to efficiently extract electrical energy. On the other hand, when a voltage obtained by optical power reception is applied to a photodiode, there is a possibility that the energy extraction efficiency is rather degraded due to consumption of electrical energy.

The present invention aims to provide an optical power receiving device capable of efficiently extracting electrical energy, a communication apparatus, and an optical power receiving method.

Solution to Problem

A mode of the present invention is an optical power receiving device that includes: a photodiode that has a light receiving portion connected to an external light source via an optical transmission line; a power storage unit that stores electrical energy generated by the photodiode; and a bias circuit that takes out electrical energy corresponding to an amount of stored power from the power storage unit, and applies a voltage to a cathode of the photodiode.

A mode of the present invention is a communication apparatus that includes: the above optical power storage device; and a communication unit that operates by electrical energy supplied from the power storage unit, and communicates with another communication apparatus, the another communication apparatus including the external light source.

A mode of the present invention is an optical power receiving method that includes: a step of converting light supplied from an external light source via an optical transmission line into electrical energy with a photodiode; a step of storing the electrical energy into a power storage unit; and a step of applying a voltage to a cathode of the photodiode, after taking out electrical energy corresponding to an amount of stored power from the power storage unit.

Advantageous Effects of Invention

According to the present invention, it is possible to efficiently extract electrical energy.

DESCRIPTION OF EMBODIMENTS

First Embodiment

<<Configuration of a Communication System 1>>

The following is a detailed description of embodiments, with reference to the drawings.

Figure 1:
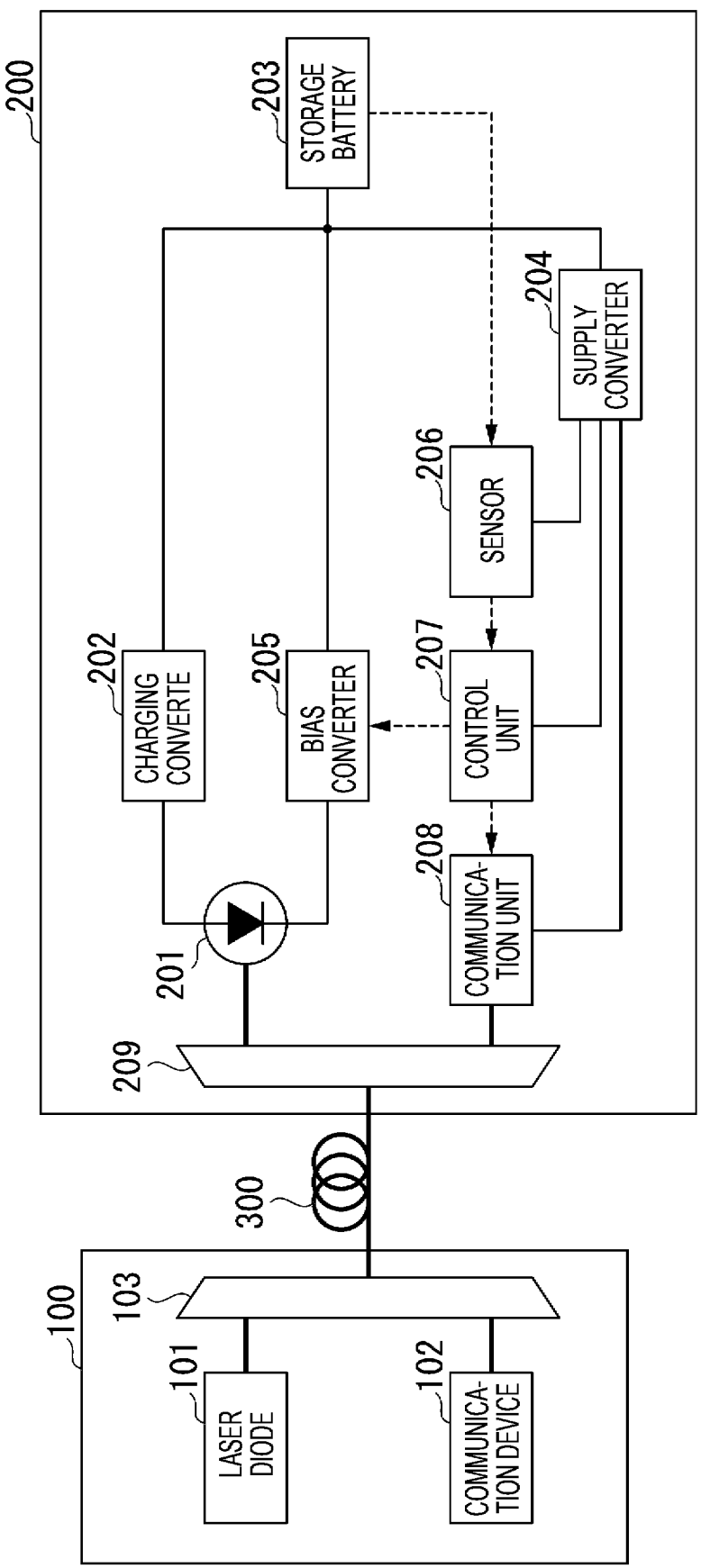
FIG. 1 is a schematic diagram illustrating the configuration of a communication system according to a first embodiment.

FIG. 1 is a schematic diagram illustrating the configuration of a communication system 1 according to a first embodiment. In FIG. 1, solid lines represent power lines, and dashed lines represent control lines. The communication system 1 according to the first embodiment includes a CU device 100 (a central unit) and an RU device 200 (a remote unit). The CU device 100 intensively controls an information communication network. The RU device 200 is disposed at a distance from the CU device 100. The CU device 100 and the RU device 200 are connected via an optical fiber cable 300, and perform communication using optical signals. The RU device 200 is not connected to any commercial power supply, and operates by converting light supplied from the CU device 100 into electrical energy. The RU device 200 is an example of an optical power receiving device. Accordingly, at the time of installation, the RU device 200 does not need to secure an external power supply such as a commercial power supply that can constantly supply power.

<<Configuration of the CU Device 100>>

The CU device 100 includes a laser diode 101, a communication unit 102, and an optical multiplexer/demultiplexer 103. The laser diode 101 outputs light to be used as the power source of the RU device 200. The communication unit 102 transmits and receives optical signals for communication. Specifically, the communication unit 102 encodes and converts digital data into an electrical signal, and converts the electrical signal into an optical signal. The communication unit 102 also converts an optical signal into an electrical signal, and decodes the electrical signal into digital data. An optical signal for communication is a signal in a frequency band different from that of the light emitted by the laser diode 101. The optical multiplexer/demultiplexer 103 multiplexes the light emitted from the laser diode 101 and light emitted from the communication unit 102, and outputs the multiplexed light to the RU device 200 via the optical fiber cable 300. The optical multiplexer/demultiplexer 103 also demultiplexes light transmitted from the RU device 200 via the optical fiber cable 300 into a communication frequency band and the other frequency band, and transmits the light related to the communication frequency band to the communication unit 102. The light related to the other frequency band may be transmitted to the side of the laser diode 101, or may be subjected to a termination process.

<<Configuration of the RU Device 200>>

The RU device 200 includes a photodiode 201, a charging converter 202, a storage battery 203, a supply converter 204, a bias converter 205, a sensor 206, a control unit 207, a communication unit 208, and an optical multiplexer/demultiplexer 209. Note that the photodiode 201, the charging converter 202, the storage battery 203, the supply converter 204, the bias converter 205, the sensor 206, and the control unit 207 constitute an optical power storage device.

The photodiode 201 is a light receiving element that converts light energy into electrical energy. The photodiode 201 has a pin structure, for example. When the light receiving portion of the photodiode 201 is irradiated with light, a current flowing from the cathode to the anode of the photodiode 201 is generated. Note that, when a voltage of a certain level or higher is applied to the cathode of the photodiode 201 (when a reverse bias voltage is applied), multiplication of photoelectrons occurs due to avalanche breakdown of the photodiode 201. Accordingly, by applying a voltage equal to or higher than a certain level to the photodiode 201, it is possible to enhance the photoelectric conversion efficiency of the photodiode 201. Note that the voltage at which avalanche breakdown of the photodiode 201 occurs is determined by the material of the photodiode 201.

The charging converter 202 is a DCDC converter that charges the storage battery 203 with electrical energy generated by the photodiode 201. Specifically, the charging converter 202 boosts the voltage between the anode and the GND of the photodiode 201 to a charging voltage value, and applies the boosted voltage to the storage battery 203. The storage battery 203 is an example of a power storage unit. In other embodiments, a capacitor may be provided as a power storage unit.

The supply converter 204 is a DCDC converter that supplies the electrical energy stored in the storage battery 203 to the sensor 206, the control unit 207, and the communication unit 208. That is, the supply converter 204 converts the terminal voltage of the storage battery 203 into a load voltage suitable for the sensor 206, a load voltage suitable for the control unit 207, and a load voltage suitable for the communication unit 208. The supply converter 204 may be a single-inductor-multi-output (SIMO) converter or a combination of a plurality of DCDC converters.

The bias converter 205 is a DCDC converter that takes out electrical energy from the storage battery 203 in accordance with a control signal received from the control unit 207, converts the electrical energy into a bias voltage of a predetermined value, and applies the bias voltage to the cathode of the photodiode 201. The value of the bias voltage is higher than the voltage at which avalanche breakdown of the photodiode 201 occurs. The bias converter 205 may have a function of determining whether to output a voltage in accordance with a control signal from the control unit 207, or may include a switch that is switched on and off by a control signal between the bias converter and the storage battery 203. The bias converter 205 is an example of a bias circuit.

The sensor 206 measures the amount of power stored in the storage battery 203. For example, the sensor 206 may calculate the amount of stored power from the terminal voltage of the storage battery 203, or may calculate the amount of stored power by integrating the terminal current of the storage battery 203.

The control unit 207 controls the communication unit 208 and the bias converter 205. For example, the control unit 207 processes a signal received by the communication unit 208, and causes the communication unit 208 to transmit the signal. The control unit 207 also controls the bias converter 205 on the basis of the amount of power stored in the storage battery 203 and measured by the sensor 206. Specifically, in a case where the amount of power stored in the storage battery 203 is equal to or larger than a predetermined value, the control unit 207 outputs a control signal for causing the bias converter 205 to output a voltage. In a case where the amount of power stored in the storage battery 203 is smaller than the predetermined value, on the other hand, the control unit 207 does not output the control signal for causing the bias converter 205 to output a voltage. Accordingly, the bias converter 205 applies a voltage to the cathode of the photodiode 201 in accordance with the amount of power stored in the storage battery 203.

The communication unit 208 transmits and receives optical signals for communication.

The optical multiplexer/demultiplexer 209 demultiplexes light transmitted from the CU device 100 via the optical fiber cable 300 into a communication frequency band and a power frequency band, transmits the light related to the communication frequency band to the communication unit 102, and transmits the light related to the power frequency band to the photodiode 201. The optical multiplexer/demultiplexer 209 also outputs an optical signal transmitted by the communication unit 102 to the CU device 100 via the optical fiber cable 300.

<<Operation of the Communication System 1>>

The CU device 100 and the RU device 200 are connected via the optical fiber cable 300. Note that the storage battery 203 of the RU device 200 may not be charged beforehand. Light for power output from the laser diode 101 is transmitted from the optical multiplexer/demultiplexer 103 to the optical fiber cable 300, and reaches the RU device 200.

The light for power having reached the RU device 200 is transmitted to the photodiode 201 by the optical multiplexer/demultiplexer 209. In a case where the amount of power stored in the storage battery 203 is smaller than a predetermined value, the bias converter 205 does not take out power from the storage battery 203. The photodiode 201 converts the light for power into electrical energy, and generates a current flowing from the cathode to the anode. As a result, the charging converter 202 charges the storage battery 203 with the electrical energy generated by the photodiode 201. The electrical energy stored in the storage battery 203 is supplied to the sensor 206, the control unit 207, and the communication unit 208 by the supply converter 204. While the amount of power stored in the storage battery 203 is smaller than the predetermined value, the bias converter 205 does not take out power from the storage battery 203, and accordingly, it is possible to preferentially secure the power necessary for driving the sensor 206, the control unit 207, and the communication unit 208.

When the charging of the storage battery 203 progresses, and the amount of power stored in the storage battery 203 becomes equal to or larger than the predetermined value, the control unit 207 determines the amount of stored power to be equal to or larger than the predetermined value from the value measured by the sensor 206, and outputs a control signal for causing the bias converter 205 to output a voltage. Accordingly, when the amount of power stored in the storage battery 203 is equal to or larger than the predetermined value, the bias converter 205 applies a voltage to the cathode of the photodiode 201, using the electrical energy stored in the storage battery 203.

As the bias converter 205 starts applying a voltage to the cathode of the photodiode 201, the efficiency of photoelectric conversion by the photodiode 201 can be enhanced.

Functions and Effects

In the communication system 1 according to the first embodiment, the RU device 200 takes out electrical energy corresponding to the amount of stored power from the storage battery 203, and applies a voltage to the cathode of the photodiode 201. Accordingly, the RU device 200 can enhance the efficiency of photoelectric conversion by the photodiode 201 in a case where the amount of power stored in the storage battery 203 is large, while reducing consumption of electrical energy to be supplied to other components such as the communication unit 208 and the control unit 207 in a case where the amount of power stored in the storage battery 203 is small.

Also, in the communication system 1 according to the first embodiment, the bias converter 205 takes out the electrical energy for applying the voltage related to the bias voltage value from the storage battery 203 in a case where the amount of power stored in the storage battery 203 is equal to or larger than the threshold, but does not take out electrical energy from the storage battery 203 in a case where the amount of power stored in the storage battery 203 is smaller than the threshold.

The enhancement caused in efficiency by applying a voltage to the photodiode 201 is brought about by avalanche breakdown of the photodiode 201. Therefore, a voltage low enough not to cause avalanche breakdown in the photodiode 201 hardly contributes to enhancement in photoelectric conversion efficiency. Accordingly, in a case where the amount of stored power is not large enough, the RU device 200 according to the first embodiment can reduce electrical energy consumption by not applying a voltage to the photodiode 201.

Further, in a case where the voltage applied to the photodiode 201 is large enough to cause avalanche breakdown, the influence of the difference in voltage level on the photoelectric conversion efficiency is small. Accordingly, in a case where the amount of stored power is large enough, the RU device 200 according to the first embodiment can reduce electrical energy consumption by applying the minimum voltage at which avalanche breakdown can occur, to the photodiode 201.

Second Embodiment

The RU device 200 according to the first embodiment is not connected to any external power supply, but the RU device 200 according to a second embodiment is connected to a primary battery 210 that is an external power supply, separately from the storage battery 203. Note that, since the external power source is the primary battery 210, the RU device 200 according to the second embodiment does not need to secure an external power supply such as a commercial power supply that can constantly supply power, at the time of installation as in the first embodiment.

<<Configuration of the RU Device 200>>

Figure 2:
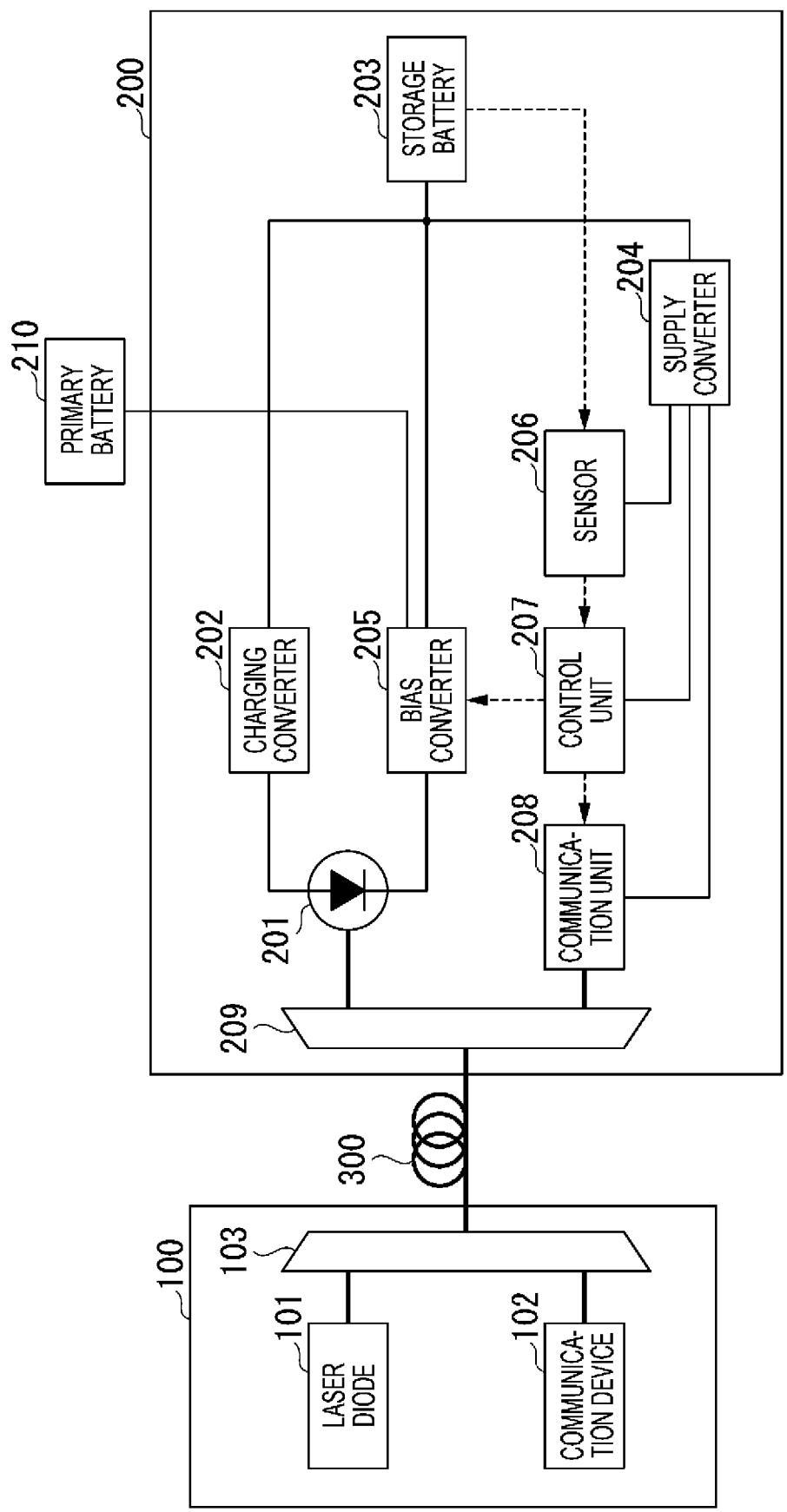
FIG. 2 is a schematic diagram illustrating the configuration of a communication system according to a second embodiment.

FIG. 2 is a schematic diagram illustrating the configuration of a communication system 1 according to the second embodiment. The communication system 1 according to the second embodiment has the same configuration as that of the first embodiment, except that the RU device 200 is connected to the primary battery 210. The RU device 200 according to the second embodiment differs from the first embodiment in operations of the bias converter 205 and the control unit 207. The bias converter 205 according to the second embodiment generates a voltage to be applied to the cathode of the photodiode 201, from the electrical energy held by the storage battery 203 or the primary battery 210, in accordance with a control signal received from the control unit 207. That is, the bias converter 205 according to the second embodiment constantly applies a voltage to the cathode of the photodiode 201 while in operation. The bias converter 205 may have a function of selecting an electrical energy source in accordance with a control signal from the control unit 207, or may include a switch capable of switching the connection destination between the storage battery 203 and the primary battery 210 in accordance with a control signal.

In a case where the amount of power stored in the storage battery 203 is equal to or larger than a predetermined value, the control unit 207 outputs a control signal for determining the storage battery 203 to be the electrical energy source of the bias converter 205. In a case where the amount of power stored in the storage battery 203 is smaller than the predetermined value, on the other hand, the control unit 207 outputs a control signal for determining the primary battery 210 to be the electrical energy source of the bias converter 205, so that the amount of electrical energy to be acquired from the storage battery 203 by the bias converter 205 is determined depending on the amount of power stored in the storage battery 203.

Functions and Effects

According to the second embodiment, in a case where the amount of power stored in the storage battery 203 is smaller than the threshold, the bias converter 205 of the RU device 200 applies a voltage related to the bias voltage value to the cathode of the photodiode 201, using electrical energy supplied from the primary battery 210, which is an external power supply. That is, the RU device 200 applies a voltage to the photodiode 201, regardless of the amount of power stored in the storage battery 203. Accordingly, the RU device 200 can constantly enhance the efficiency of photoelectric conversion by the photodiode 201.

Note that the RU device 200 according to the second embodiment includes the primary battery 210 as an external power supply, but is not limited to this configuration. An external power supply according to some other embodiment may be a commercial power supply or a power generating unit such as a solar cell.

Third Embodiment

In the communication system 1 according to the first embodiment, the RU device 200 determines whether to apply a bias voltage to the photodiode 201. However, in a communication system 1 according to a third embodiment, the CU device 100 determines whether the RU device 200 is to apply a bias voltage to the photodiode 201.

<<Configuration of a Communication System 1>>

Figure 3:
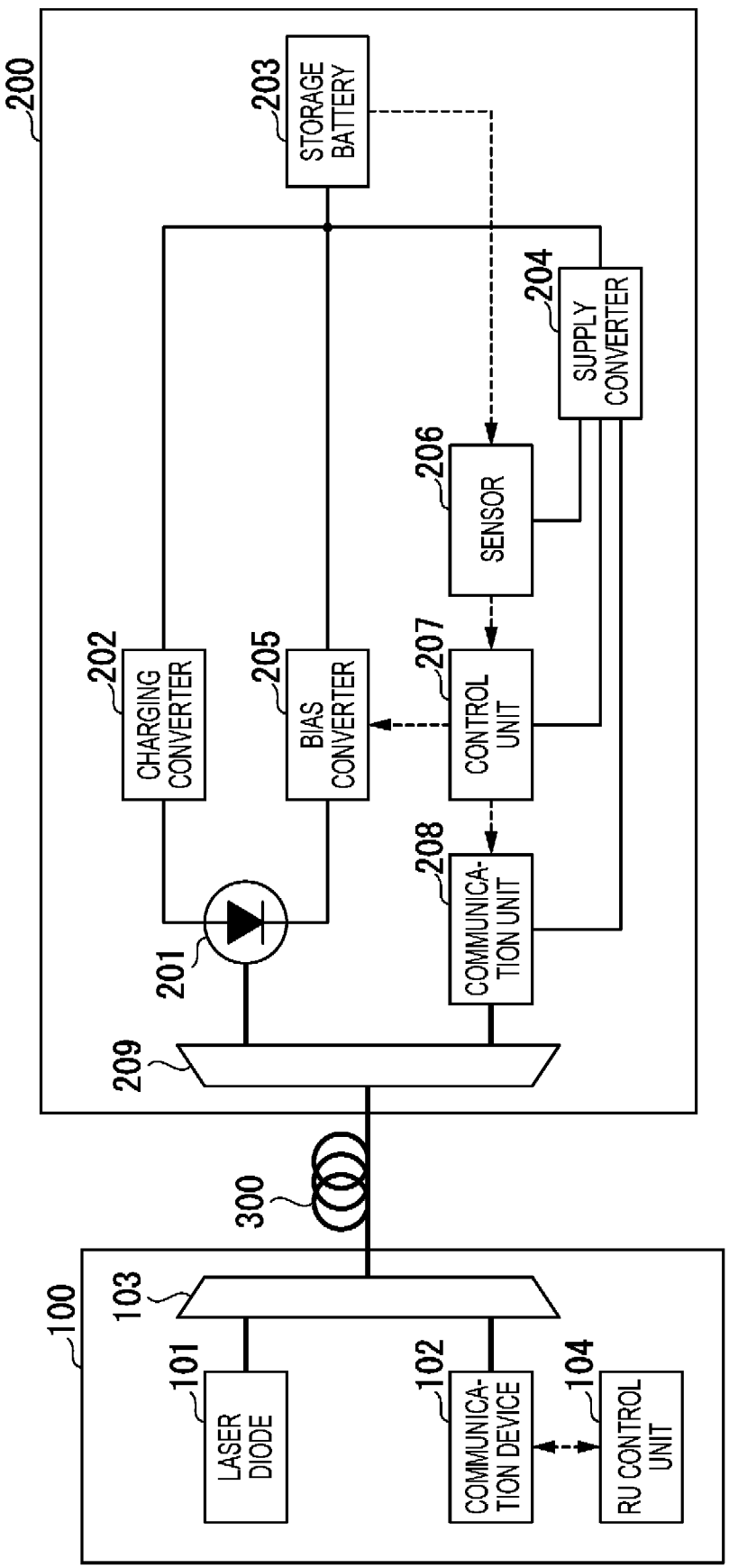
FIG. 3 is a schematic diagram illustrating the configuration of a communication system according to a third embodiment.

FIG. 3 is a schematic diagram illustrating the configuration of the communication system 1 according to the third embodiment. The CU device 100 according to the third embodiment includes an RU control unit 104, in addition to the components according to the first embodiment. The RU control unit 104 determines whether to apply a bias voltage to the photodiode 201, on the basis of the measured value of the amount of power stored in the storage battery 203, the measured value having been received from the RU device 200. The RU control unit 104 outputs, to the communication unit 102, a transmission instruction to cause the RU device 200 to transmit a result of the determination as to whether to apply a bias voltage.

The RU device 200 according to the third embodiment differs from the first embodiment in the operation of the control unit 207. The control unit 207 according to the third embodiment outputs, to the communication unit 208, a transmission instruction for causing the CU device 100 to transmit a measured value of the stored power amount measured by the sensor 206. The control unit 207 also outputs a control signal to the bias converter 205, in accordance with the result of the determination as to whether to apply a bias voltage, the result having been received by the communication unit 208 from the CU device 100.

Functions and Effects

The control unit 207 of the RU device 200 according to the third embodiment does not have a function of determining whether to apply a bias voltage to the photodiode 201. Accordingly, the configuration of the control unit 207 can be simplified, and thus, the RU device 200 can be formed at low cost. Note that, in other embodiments, a plurality of RU devices 200 may be connected to the CU device 100, and the CU device 100 may determine whether the respective RU devices 200 should apply a bias voltage.

Note that, in other embodiments, the CU device 100 may determine the storage battery 203 or the primary battery 210 to be the electrical energy source of the bias converter 205, like the control unit 207 according to the second embodiment.

Fourth Embodiment

In the RU device 200 according to the first embodiment, the control unit 207 controls the bias voltage to be applied to the photodiode 201. On the other hand, the control unit 207 of the RU device 200 according to a fourth embodiment does not control the bias voltage.

<<Configuration of a Communication System>>

Figure 4:
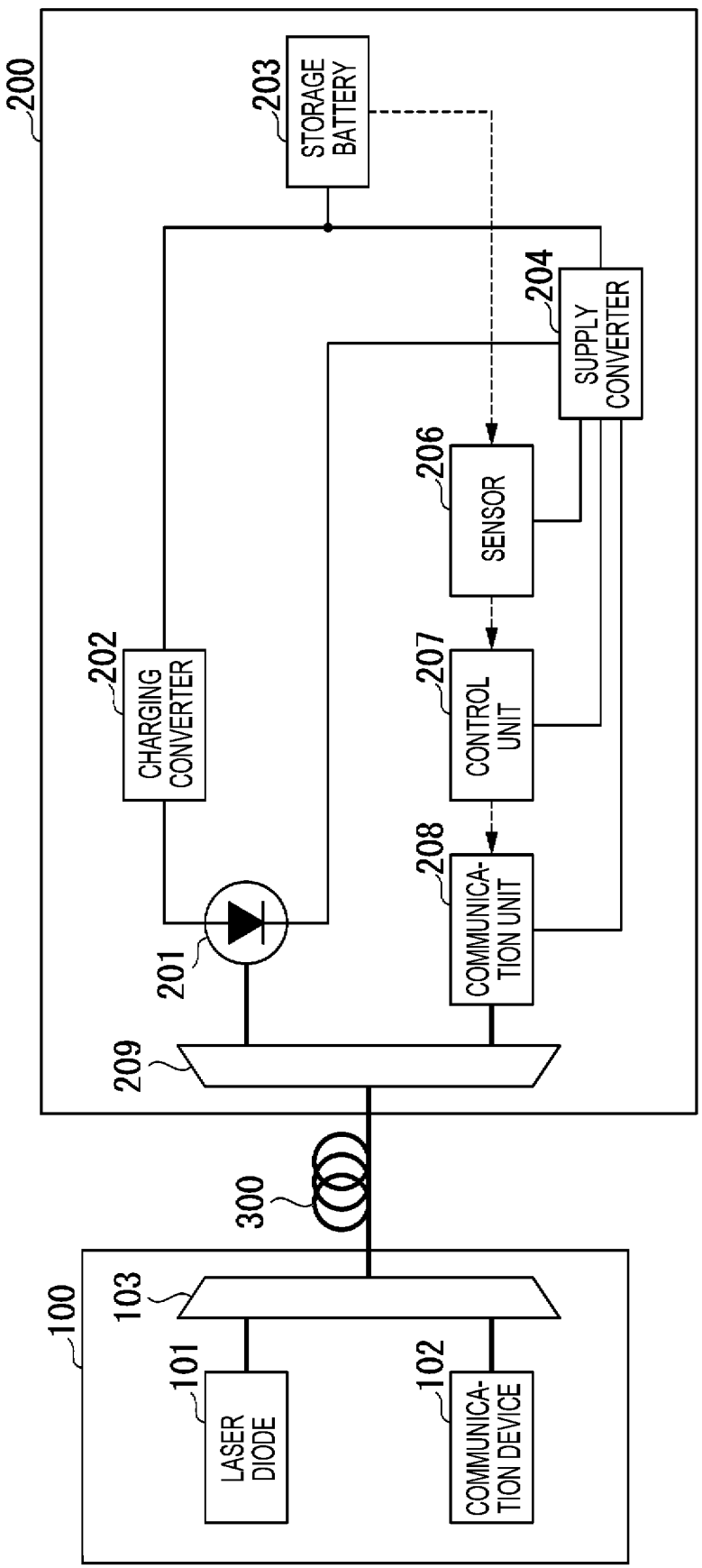
FIG. 4 is a schematic diagram illustrating the configuration of a communication system according to a fourth embodiment.

FIG. 4 is a schematic diagram illustrating the configuration of a communication system 1 according to the fourth embodiment. The RU device 200 according to the fourth embodiment does not include the bias converter 205 among the components according to the first embodiment. Further, the supply converter 204 according to the fourth embodiment applies a bias voltage to the cathode of the photodiode 201. That is, the supply converter 204 according to the fourth embodiment applies a bias voltage to the photodiode 201, regardless of the control by the control unit 207.

The supply converter 204 according to the fourth embodiment is a step-down DCDC converter that generates a bias voltage by stepping down the electrical energy held in the storage battery 203. Therefore, in a case where the terminal voltage of the storage battery 203 is equal to or higher than the bias voltage value, the supply converter 204 steps down the electrical energy of the storage battery 203 to the bias voltage value, and applies the resultant voltage to the photodiode 201. In a case where the terminal voltage of the storage battery 203 is lower than the bias voltage value, on the other hand, the supply converter 204 applies the terminal voltage lower than the bias voltage value to the photodiode 201. Accordingly, the supply converter 204 according to the fourth embodiment takes out electrical energy corresponding to the amount of stored power from the storage battery 203, and applies a voltage to the cathode of the photodiode 201. The supply converter 204 according to the fourth embodiment is an example of a bias circuit.

Other Embodiments

Although embodiments have been described in detail with reference to the drawings, specific configurations are not limited to the above-described configurations, and various design changes and the like can be made thereto. That is, in other embodiments, the order of the above-described processes may be changed as appropriate. Further, some processes may be executed in parallel.

The RU device 200 according to the above-described embodiments may be formed with a single computer, or the components of the RU device 200 may be disposed to be divided into a plurality of computers, and the plurality of computers may function as the RU device 200 in cooperation with each other.

The communication system 1 according to the above-described embodiments transmits power light and communication light via the same optical fiber cable 300, but does not necessarily do so. For example, the communication system 1 according to some other embodiment may include an independent optical fiber cable for transmitting power light and another independent optical fiber cable for transmitting communication light. In this case, the CU device 100 and the RU device 200 may not include any optical multiplexer/demultiplexer.

The control unit 207 described above is a computer that includes a processor, a memory, an auxiliary storage device, and the like connected by a bus, and executes a program to function as the control unit 207 described above. Examples of the processor include a central processing unit (CPU), a graphic processing unit (GPU), and a microprocessor.

The program may be recorded in a computer-readable recording medium. The computer-readable recording medium is a storage device such as a magnetic disk, a magneto-optical disk, an optical disk, or a semiconductor memory, for example. The program may be transmitted via an electrical communication line.

All or some of the functions of the control unit 207 may be realized by using a custom large scale integrated circuit (LSI) such as an application specific integrated circuit (ASIC) or a programmable logic device (PLD). Examples of the PLD include a programmable array logic (PAL), a generic array logic (GAL), a complex programmable logic device (CPLD), and a field programmable gate array (FPGA). Such an integrated circuit is also included in an example of the processor.

REFERENCE SIGNS LIST

1 communication system
100 CU device
101 laser diode
102 communication unit
103 optical multiplexer/demultiplexer
104 RU control unit
200 RU device
201 photodiode
202 charging converter
203 storage battery
204 supply converter
205 bias converter
206 sensor
207 control unit
208 communication unit
209 optical multiplexer/demultiplexer
210 primary battery
300 optical fiber cable

The invention claimed is:

1. An optical power receiving device comprising:
a photodiode that has a light receiving portion connected to an external light source via an optical transmission line;
a power storage that stores electrical energy generated by the photodiode; and
a bias circuit configured to take out electrical energy corresponding to an amount of stored power from the power storage, and configured to apply a voltage to a cathode of the photodiode,
wherein the bias circuit does not take out the electrical energy from the power storage and charges the power storage with the electrical energy while the amount of stored power in the power storage is smaller than a threshold, and takes out the electrical energy for applying a voltage related to a predetermined bias voltage value from the power storage when the amount of stored power in the power storage becomes equal to or larger than the threshold by charging the power storage with the electrical energy.

2. The optical power receiving device according to claim 1, wherein, when the amount of stored power in the power storage is smaller than the threshold, the bias circuit applies the voltage related to the predetermined bias voltage value to the cathode of the photodiode, using electrical energy supplied from an external power supply.

3. A communication apparatus comprising:
the optical power receiving device according to claim 1; and
a communication device configured to operate by electrical energy supplied from the power storage, and configured to communicate with another communication apparatus, the another communication apparatus including the external light source, wherein the optical power receiving device further comprises a supply circuit configured to supply the electrical energy from the power storage to the communication device,
wherein the supply circuit preferentially supplies the electrical energy required to drive the communication device from the power storage to the communication device while the amount of stored power in the power storage is smaller than the threshold.

4. The communication apparatus according to claim 3, wherein the communication device communicates with the another communication apparatus via the optical transmission line.

5. An optical power receiving method comprising:
converting light supplied from an external light source via an optical transmission line into electrical energy with a photodiode;
storing the electrical energy into a power storage; and
applying a voltage to a cathode of the photodiode, after taking out electrical energy corresponding to an amount of stored power from the power storage,
wherein, in the applying the voltage,
the electrical energy is not taken out from the power storage and the power storage is charged with the electrical energy while the amount of stored power in the power storage is smaller than a threshold, and
the electrical energy for applying a voltage related to a predetermined bias voltage value is taken out from the power storage when the amount of stored power in the power storage becomes equal to or larger than the threshold by charging the power storage with the electrical energy.

* * * * *